(12) United States Patent
Swett et al.

(10) Patent No.: US 8,922,988 B2
(45) Date of Patent: Dec. 30, 2014

(54) HIGH TEMPERATURE AND VIBRATION PROTECTIVE ELECTRONIC COMPONENT PACKAGING

(75) Inventors: Dwight W. Swett, Houston, TX (US); Holger C. Stibbe, Humble, TX (US); Brent D. Hope, Spring, TX (US)

(73) Assignee: Baker Hughes Incorporated, Houston, TX (US)

( * ) Notice: Subject to any disclaimer, the term of this patent is extended or adjusted under 35 U.S.C. 154(b) by 322 days.

(21) Appl. No.: 13/414,138

(22) Filed: Mar. 7, 2012

(65) Prior Publication Data

US 2013/0235537 A1 Sep. 12, 2013

(51) Int. Cl.
*H05K 5/00* (2006.01)

(52) U.S. Cl.
USPC .................................................. 361/679.36

(58) Field of Classification Search
USPC .................................................. 361/679.36
See application file for complete search history.

(56) References Cited

U.S. PATENT DOCUMENTS

| | | | |
|---|---|---|---|
| 3,585,569 A * | 6/1971 | Moran | 439/371 |
| 5,212,495 A | 5/1993 | Winkel et al. | |
| 6,134,892 A * | 10/2000 | Turner et al. | 62/3.2 |
| 7,137,444 B2 | 11/2006 | Faybishenko et al. | |
| 7,252,174 B2 * | 8/2007 | Cox et al. | 181/111 |
| 7,364,007 B2 * | 4/2008 | Garcia-Osuna et al. | 181/108 |
| 7,687,571 B2 | 3/2010 | Vaidya et al. | |
| 7,735,579 B2 * | 6/2010 | Gopalan et al. | 175/40 |
| 2002/0153136 A1 | 10/2002 | Kruspe et al. | |
| 2005/0263668 A1 * | 12/2005 | Thigpen et al. | 248/560 |
| 2007/0086156 A1 | 4/2007 | Skinner | |
| 2007/0289778 A1 * | 12/2007 | Watkins et al. | 175/40 |
| 2009/0284910 A1 * | 11/2009 | Heo et al. | 361/679.36 |
| 2010/0108306 A1 * | 5/2010 | Cooper | 166/65.1 |

OTHER PUBLICATIONS

Notification of Transmittal of the International Search Report and the Written Opinion of the International Searching Authority, or the Declaration; PCT/US2013/028972; Dated: Mar. 5, 2013, 12 pages.
Veprik, et al. "Vibration Protection of Sensitive Electronic Equipment from Harsh Harmonic Vibration". Journal of Sound and Vibration (2000) 238(1), 19-30.
Veprik, et al., "Vibration Protection of Sensitive Electronic Equipment from Harsh Harmonic Vibration", Journal of Sound and Vibration, 2000, 238(1), pp. 19-30, doi:10.1006/jsvi.2000.3098, http://idealibrary.com.

* cited by examiner

*Primary Examiner* — Forrest M Phillips
(74) *Attorney, Agent, or Firm* — Cantor Colburn LLP

(57) ABSTRACT

An electronic component package for installation on a tool includes: a solid molded housing configured to hold an electronic component support structure and surround electronic components disposed on the support structure; the housing including a first portion configured to hold the support structure, and a second portion forming a cavity around the electronic components disposed on the support structure and isolating the electronic components from contact with the housing; and a viscoelastic damping layer disposed within the first portion, the viscoelastic cushion configured to damp vibrations and strain transmitted from the tool, the viscoelastic damping layer forming a constrained layer between the support structure and the first portion and configured to isolate the support structure from the housing.

20 Claims, 8 Drawing Sheets ically include printed circuit boards (PCBs) that are packaged to provide protection from downhole conditions, including temperature, pressure, vibration and other thermo-mechanical stresses.

HIGH TEMPERATURE AND VIBRATION PROTECTIVE ELECTRONIC COMPONENT PACKAGING

BACKGROUND

Exploration and production of hydrocarbons generally requires the use of various tools that are lowered into a borehole, such as drilling assemblies, measurement tools and production devices (e.g., fracturing tools). Electronic components may be disposed downhole for various purposes, such as control of downhole tools, communication with the surface and storage and analysis of data. Such electronic components typically include printed circuit boards (PCBs) that are packaged to provide protection from downhole conditions, including temperature, pressure, vibration and other thermo-mechanical stresses.

Conventional approaches for PCB packaging in drill collar or other downhole components include solid-molded subassemblies, and mounted and bolted subassemblies. Solid molded subassemblies generally use a potting material to fill an electronic assembly. Mounted subassemblies are generally assembled by hard mounting a PCB assembly with grommet insert screws directly from the circuit board into a drill collar pocket-bottom.

SUMMARY

An electronic component package for installation on a tool includes: a solid molded housing configured to hold an electronic component support structure and surround electronic components disposed on the support structure; the housing including a first portion configured to hold the support structure, and a second portion forming a cavity around the electronic components disposed on the support structure and isolating the electronic components from contact with the housing; and a viscoelastic damping layer disposed within the first portion, the viscoelastic cushion configured to damp vibrations and strain transmitted from the tool, the viscoelastic damping layer forming a constrained layer between the support structure and the first portion and configured to isolate the support structure from the housing.

An electronic component package for installation on a tool includes: a solid molded housing configured to hold an electronic component support structure and surround electronic components disposed on the support structure; and a viscoelastic damping layer disposed within the housing, the viscoelastic damping layer configured to contact the support structure and damp vibrations through directed strain energy transmitted from the tool, the damping layer including a plurality of holes extending therethrough and configured to relieve stresses created by thermal expansion of the damping layer.

BRIEF DESCRIPTION OF THE DRAWINGS

The subject matter, which is regarded as the invention, is particularly pointed out and distinctly claimed in the claims at the conclusion of the specification. The foregoing and other features and advantages of the invention are apparent from the following detailed description taken in conjunction with the accompanying drawings, wherein like elements are numbered alike, in which:

DETAILED DESCRIPTION

Various packaging devices and methods are described herein for facilitating the mounting and protection of electronic components that are incorporated with, e.g., downhole tools. Such packaging devices and assemblies provide a robust design that is well adapted to resist high-temperature downhole thermal and vibration environments. An embodiment of a packaging device includes a solid-molded outer protective shell or housing made from a relatively low thermal expansion, high vibration-damping material. For example, the housing is made from a material with a relatively low modulus of elasticity (e.g., less than or equal to about 1 MPa) and a high damping ratio (e.g., >about 30%)). The packaging assemblies described herein are configured to house electronic components such as printed circuit boards (PCBs), and have structural designs that provide distinct structural load paths to achieve an efficient dynamics and thermal design. Embodiments of a packaging assembly include a hybrid damping mechanism based on a composite shell and a viscoelastic damping mechanism (e.g., a damping pad or layer) to create an approximately non-resonant dynamic response over a broad frequency range extending, e.g., up to about 2 kHz. The packaging assembly is configured to be constrained into a tool recess or other receiving mechanism such that vibrations and associated strain energy are transmitted at least primarily into the damping mechanism. Such embodiments may be used in downhole assemblies to generally enhance high-temperature integrity of electronic components utilized in high temperature downhole operations, such as exploration, formation measurement, measurement while drilling (MWD) and logging while drilling (LWD) applications.

Figure 1:
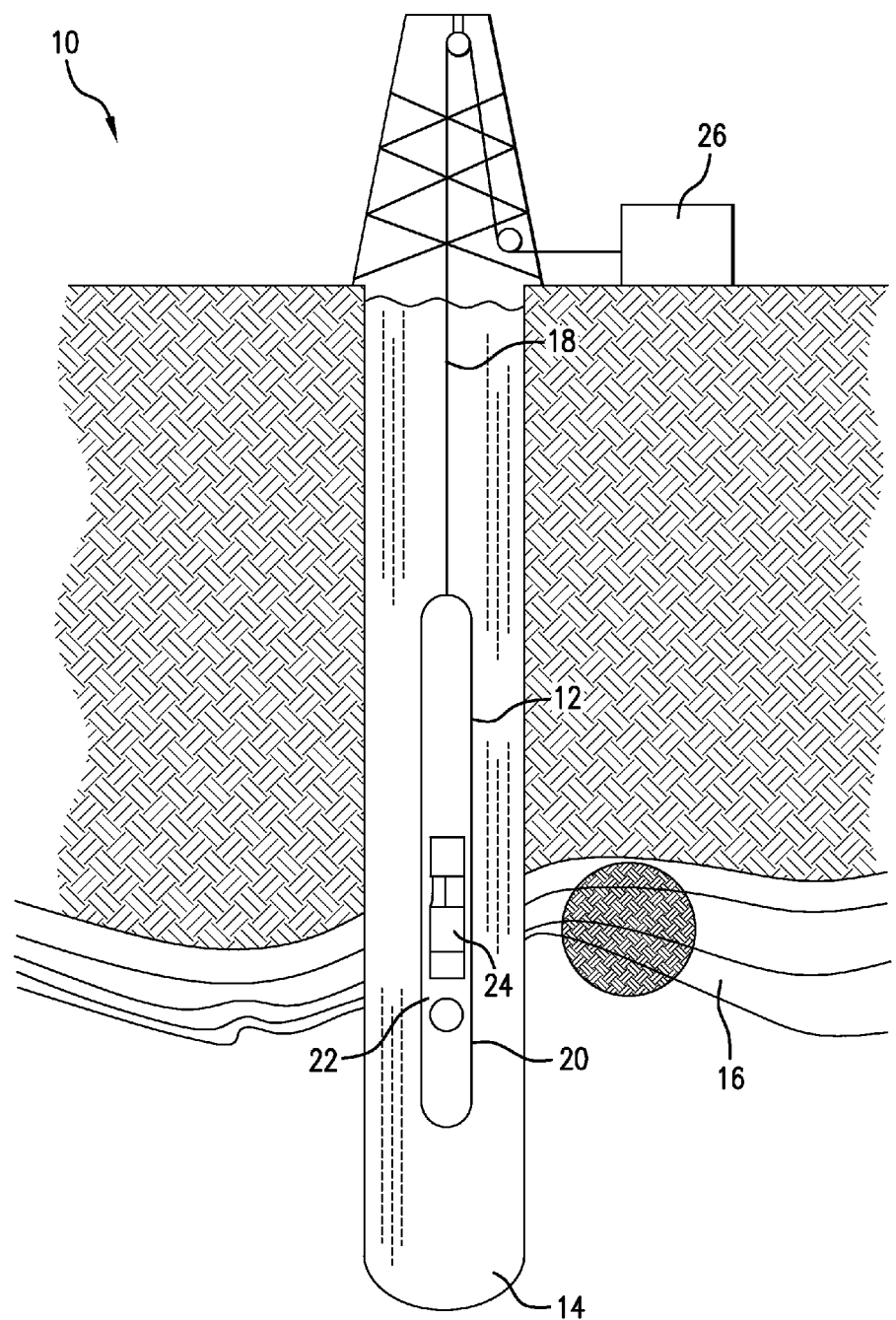
FIG. 1 illustrates an exemplary embodiment of a well logging, production and/or drilling system in a borehole penetrating the earth.

Referring to FIG. 1, an exemplary embodiment of a well logging, production and/or drilling system 10 includes a borehole string 12 that is shown disposed in a borehole 14 that penetrates at least one earth formation 16 during a drilling, well logging and/or hydrocarbon production operation. The string 12 may be lowered into the borehole 14 via, for example, a wireline 18. In other examples, the string 12 includes one or more pipe sections or coiled tubing forming segments of a tool string. In one embodiment, the system 10 also includes a bottomhole assembly (BHA) 20. In one embodiment, the BHA 18, or other portion of the borehole string 12, includes a drilling assembly and/or a measurement assembly such as a downhole tool 22 configured to estimate at least one property of the formation 14 and/or the borehole 12.

The tool 22 is connected to suitable electronics for receiving sensor measurements, storing or transmitting data, analyzing data, controlling the tool and/or performing other functions. Such electronics may be incorporated downhole in an electronics unit 24 incorporated as part of the tool 22 or other component of the string 12, and/or a surface processing unit 26. In one embodiment, the electronics unit 24 and/or the surface processing unit 26 includes components as necessary to provide for data storage and processing, communication and/or control of the tool 22.

Exemplary embodiments of the electronics unit 24 are shown in FIGS. 2-6. The electronics unit 24 is configured as a high temperature packaging assembly incorporating an electronics assembly such as a printed circuit board (PCB) 28. Although the embodiments described herein are discussed in the context of a PCB, the embodiments may be used in conjunction with any electronic component or other component that would benefit from a packaging or housing having high damping, high thermal conduction, and low fatigue stress. Furthermore, although embodiments herein are described in the context of downhole tools, components and applications, the embodiments are not so limited. The electronics unit 24 may be utilized in any applicable environment, such as a high temperature and/or vibration environment.

The electronics unit 24 includes a molded housing 30 configured to at least partially surround the PCB 28 and isolate PCB electronic components from the surrounding environment. In one embodiment, the housing 30 is made from a molded potting or encapsulating material such as a plastic, elastomer, rubber or silicone rubber material, or any other suitable material or material generally used to isolate or fill an electronic component. As described herein, "molding" refers to any method or technique for forming the housing material, such as casting, thermoforming, injection molding, extrusion, etching, etc.

Figure 2:
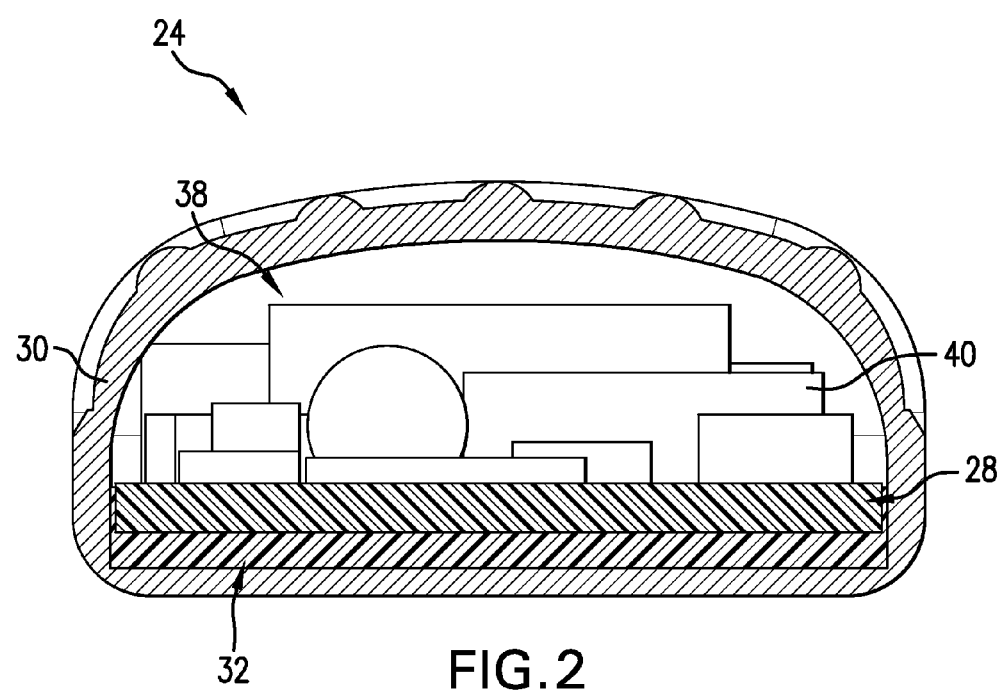
FIG. 2 illustrates a cross-sectional view of an exemplary embodiment of a packaging assembly.

The electronics component 24 also includes a damping component configured to reduce the amplitude of oscillations in the PCB 28 occurring due to vibrations of the tool or tool string. The damping component, configured in one embodiment as a viscoelastic damping pad or damping layer 32, is disposed between the PCB 28 and the housing 30. The viscoelastic material has a stiffness corresponding to an elastic modulus that is in the range of, e.g., about 0.5 to about 5 MPa. An exemplary viscoelastic material is a polymer or elastomer such as Dow Corning's® 3-6651 thermally conductive elastomer. As shown in FIG. 2, the damping layer 32 is disposed between a molded elastomer housing 30 and the PCB 28 and is in contact with the housing 30 such that there is no physical contact between the PCB 28 and the housing 30.

The molded elastomer housing 30, in one embodiment, is shaped to hold the PCB 28 therein and constrain movement of the PCB 28 within the tool. The housing 30 is also configured to direct vibration and strain energy from the tool or BHA to the damping layer 32 to minimize and/or reduce the amount of vibration and strain experienced by the PCB 28. The embodiments shown in FIGS. 3-6 illustrate a two-part housing, e.g., a clamshell housing that includes a first or lower portion 36 that is physically connected (e.g., bonded or adhered) to a second or upper portion 34. In these embodiments, the upper portion is shaped to create a cavity 38 in which various PCB components 40 are housed. The cavity 38 is configured so that the components 40 on the top of the PCB 28 do not contact the housing 30. The lower portion is configured to constrain the PCB 28 and the damping layer 32 within the housing. The configurations of the packaging assembly are not limited to those described herein. For example, as shown in FIG. 2, the housing may not consist of separate portions, but can be made of a single integral material surrounding the PCB 28.

The housing 30 may be made from any suitable material that allows for directing energy to the damping layer 32. Examples of such materials include potting materials such as polyurethane, epoxy, adhesive, silicone or silicone based materials. Such materials can be formed as thermoplastic, thermo-setting, UV curing or otherwise catalyst-based setting materials. In one embodiment, the material is a thermally conductive material having a coefficient of thermal expansion sufficient to reduce or prevent thermoelastic forces from being exerted on PCB components via the housing 30. In one embodiment, the material has a coefficient of thermal expansion that is less than about 150 ppm/deg C. at downhole temperatures.

In one embodiment, the molded housing 30 is made from a high stiffness material. As described herein, "high stiffness" refers to a stiffness that is greater than the stiffness of the damping layer 32, and a stiffness sufficient to transmit vibrations to the damping layer 32 (e.g., an elastic modulus of about 100 to about 200 MPa. In one embodiment, the high stiffness material has a stiffness that is several orders of magnitude lower than an approximate stiffness of the tool or BHA in which the electronics unit 24 is housed. An exemplary high stiffness material includes reinforcing features disposed therein. For example, the housing 30 is made from a highly thermally conductive fiber-filled elastomer such as Dow Corning's® 1-4173 (DOW 4173) thermally conductive adhesive.

The high stiffness of materials such as the DOW 4173 fiber-filled elastomer constrains the PCB perimeter similarly to prior art grommet-mount approaches and reacts PCB assembly vibration loads into the highly damped viscoelastic layer 32. This customization of reaction loads through the viscoelastic damping layer 32 between the PCB 28 and the tool provides significant attenuation of PCB vibration response over a very broad frequency range.

Figure 3:
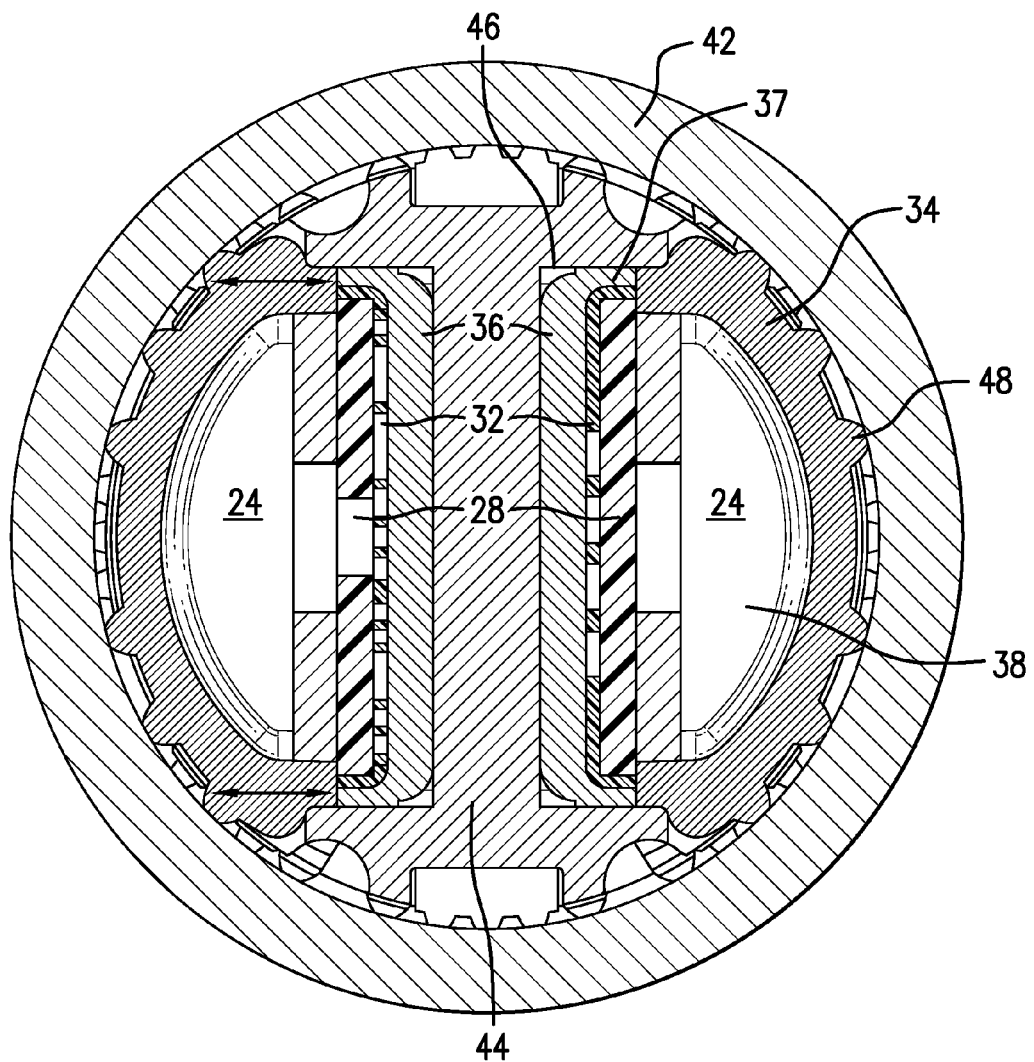
FIG. 3 illustrates a cross-sectional view of the packaging assembly of FIG. 2 disposed or mounted on a downhole tool or downhole component.

FIG. 3 illustrates an embodiment of a downhole component 42, such as the tool 22, the BHA 20, an electronics and/or sensor sub, or a collar. The component 42 includes a receiving element 44 configured to house at least part of the housing 30. In the example shown in FIG. 3, the receiving element 44 includes a pocket or recess 46 to hold and/or constrain at least the lower portion 36 in place. The lower portion 36, in conjunction with the recess 46, is configured to lock the perimeter of the PCB 28 in place similarly to edge-grommet-mounted assemblies while isolating the electronic components from deformations (e.g., vibrational, and thermoelastic deformations) of the molding material of the housing 30.

The lower portion 36 is configured to direct vibrational and other deformational loads directly to the damping pad 32, while at least mostly bypassing the PCB 28 and its components. This configuration reduces and/or minimizes vibrations experienced by the PCB 28 by directing such vibrational force through the relatively stiff housing 30 to the highly dissipative damping layer 32. In one embodiment, the lower portion 36 is disposed in the recess 46 and configured so that the entire perimeter of the lower portion (formed, e.g., by sidewalls 37 of the lower portion) is locked in contact with a surface of the recess 46. Both the sidewalls 37 of the lower portion 36 and the damping layer 32 are configured to be disposed in a fixed position relative to the recess 46 and at least the damping layer 32 is constrained and experiences a vibrationally dissipative constrained layer effect. The constraining effect can be accomplished by, e.g., shaping the lower portion 36 to conform to the shape of the recess 46 and/or creating an interference fit between the lower portion 36 and the recess 46.

In one embodiment, the upper portion 34 is also configured to direct vibrational force from the downhole component 42 to the damping layer. At least a portion of an outer surface of the upper portion 34 is disposed in contact with a surface of the component 42. For example, the upper portion 34 includes one or more protrusions or ridges 48 in contact with the tool. A dynamic load path between the outer surface and the damping layer 32 is created by the contact features of upper portion 34 to the component 42 and the locking features of upper portion 34 with receiving element 46 to direct vibrational forces to the damping layer 32 while bypassing the components 40, as the PCB 28 is entirely isolated from contact with the housing 30 via the cavity 38 and the damping pad 32.

In one embodiment, the elastomer housing 30 is shaped to maximize thermal conductivity (heat transfer) between the PCB 28 and outside components, such as the downhole component 42 or other tool on which the electronics unit 24 is mounted. For example, the bottom portion 42 is shaped so that contact between an exterior surface of the bottom portion has a maximum contact area with the tool, e.g., the tool recess 46. In another example, the unit 24 is configured to be mounted on a collar pocket or other recess in the tool 42 configured to have a flat shape having an area corresponding to a surface area of the PCB 28 and an outer surface of the bottom portion 36. The bottom portion 36 has a corresponding flat shape so that an interior surface of the bottom portion 36 is flush with and contacts the intermediate viscoelastic layer 32 and an exterior surface of the bottom portion 36 fully contacts the recess 46 or other mounting surface of the tool 42. This increased contact area combined with the higher thermal conductivity of the housing material (e.g., about 1 W/m-K) and the viscoelastic damping layer 32 (e.g., about 1.9 W/m-K), can result in a much improved thermal dissipation of electronics heat generation.

Figure 4:
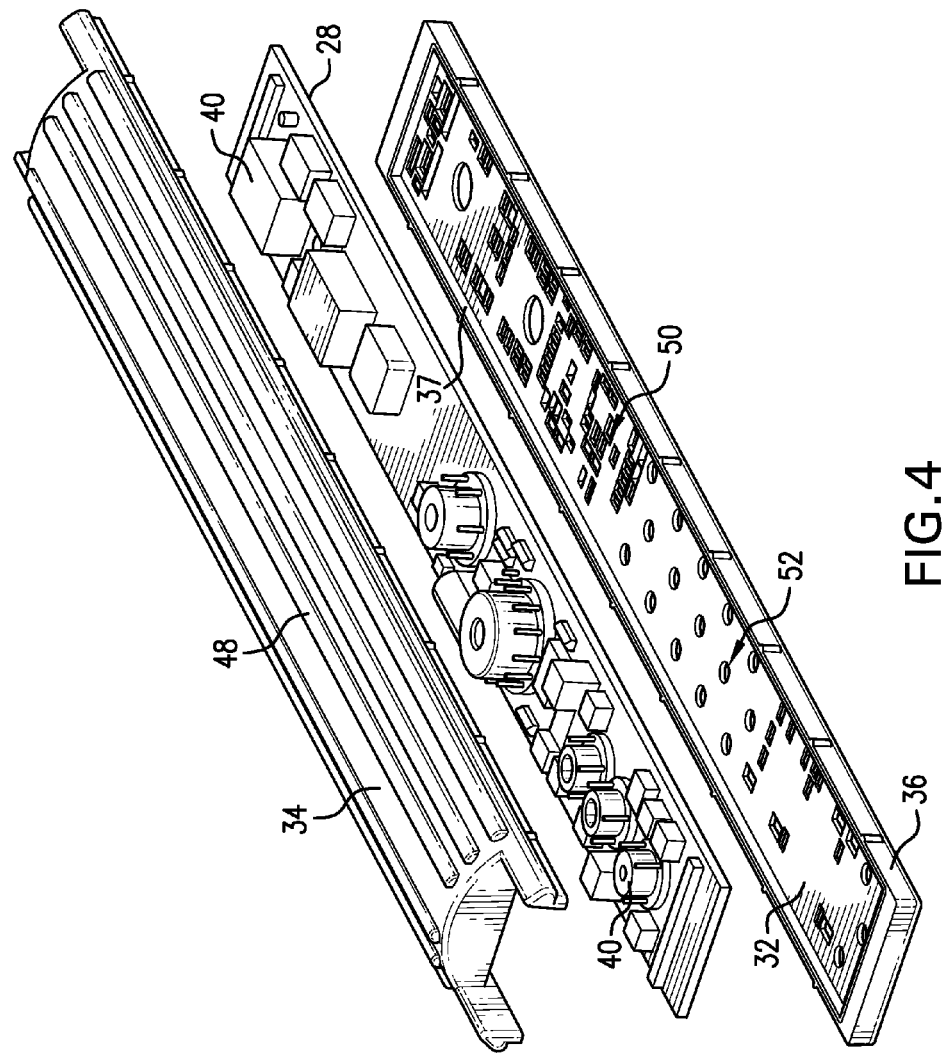
FIG. 4 is an exploded upper perspective view of an exemplary embodiment of a packaging assembly.
Figure 5:
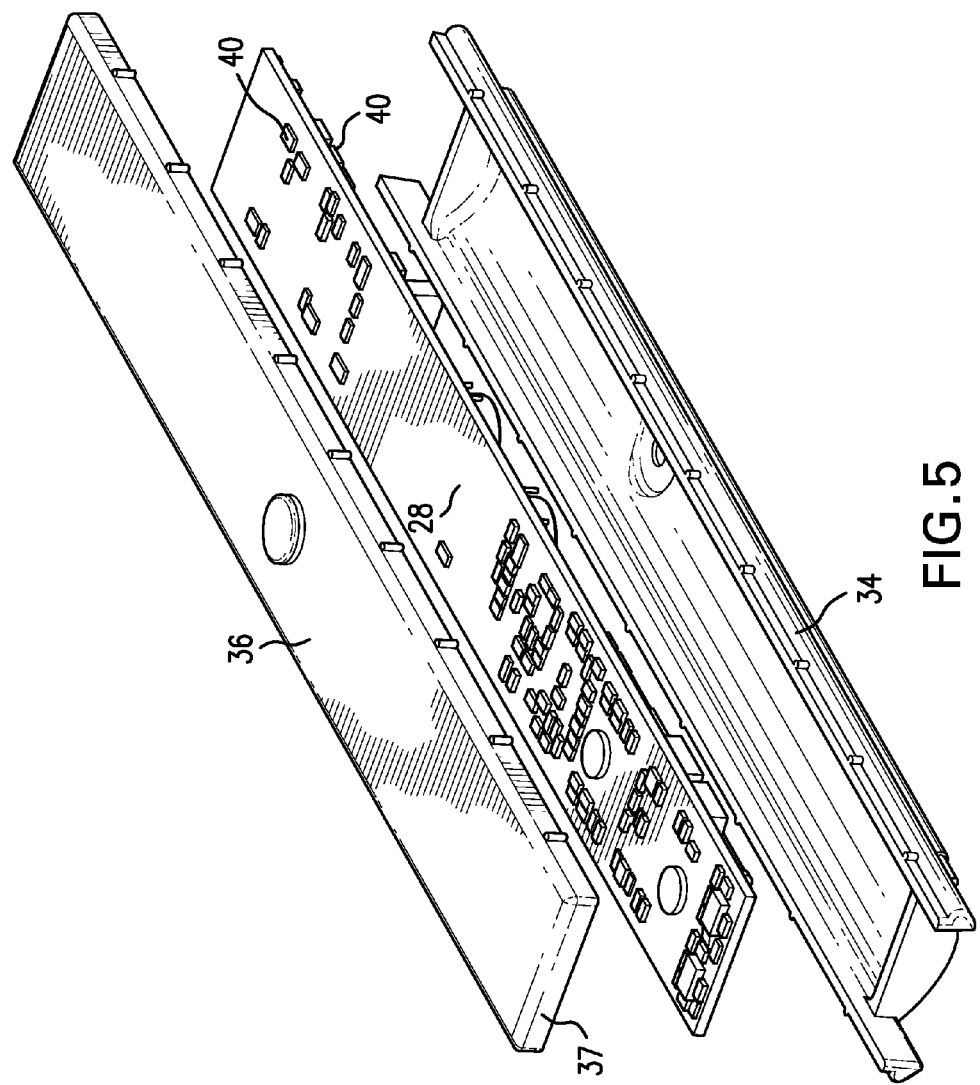
FIG. 5 is an exploded lower perspective view of the packaging assembly of FIG. 4.
Figure 6:
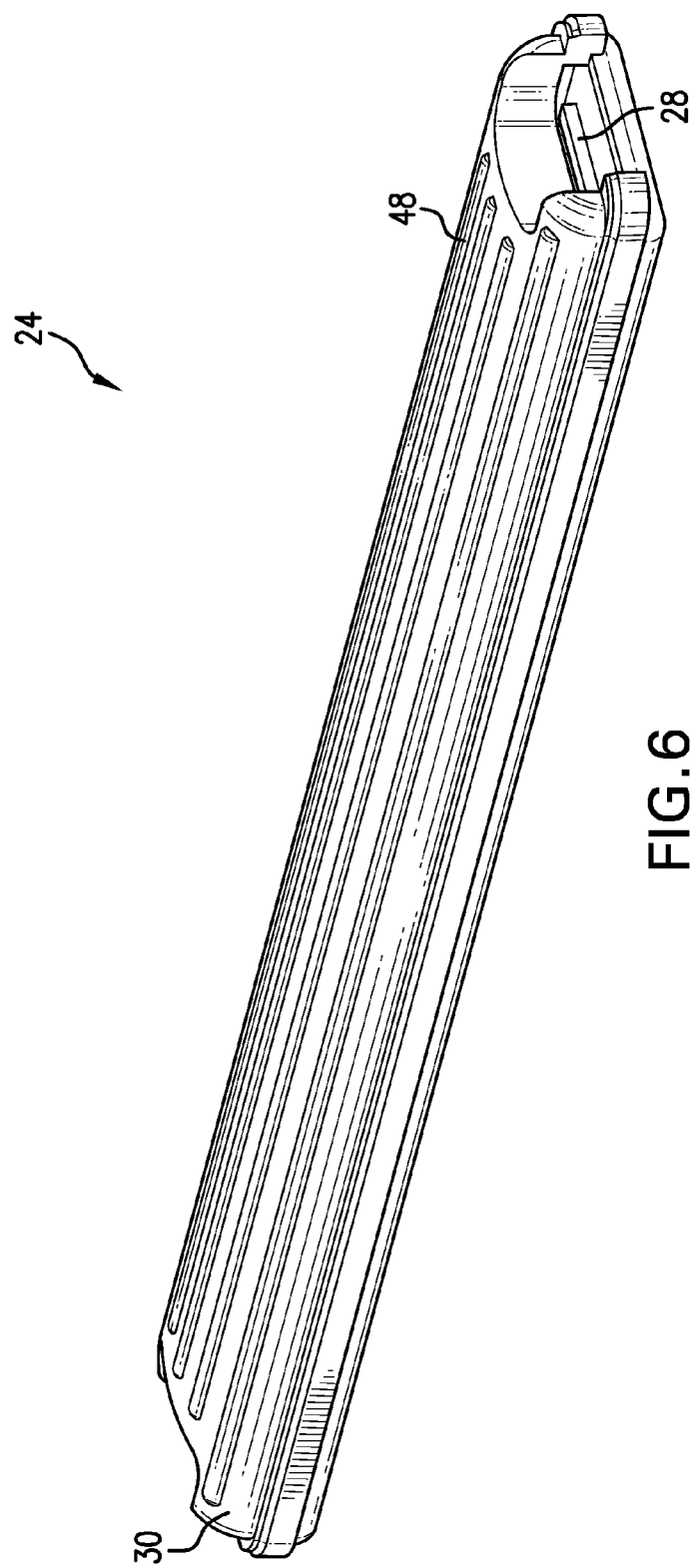
FIG. 6 is a perspective view of the packaging assembly of FIG. 4.
Figure 7:
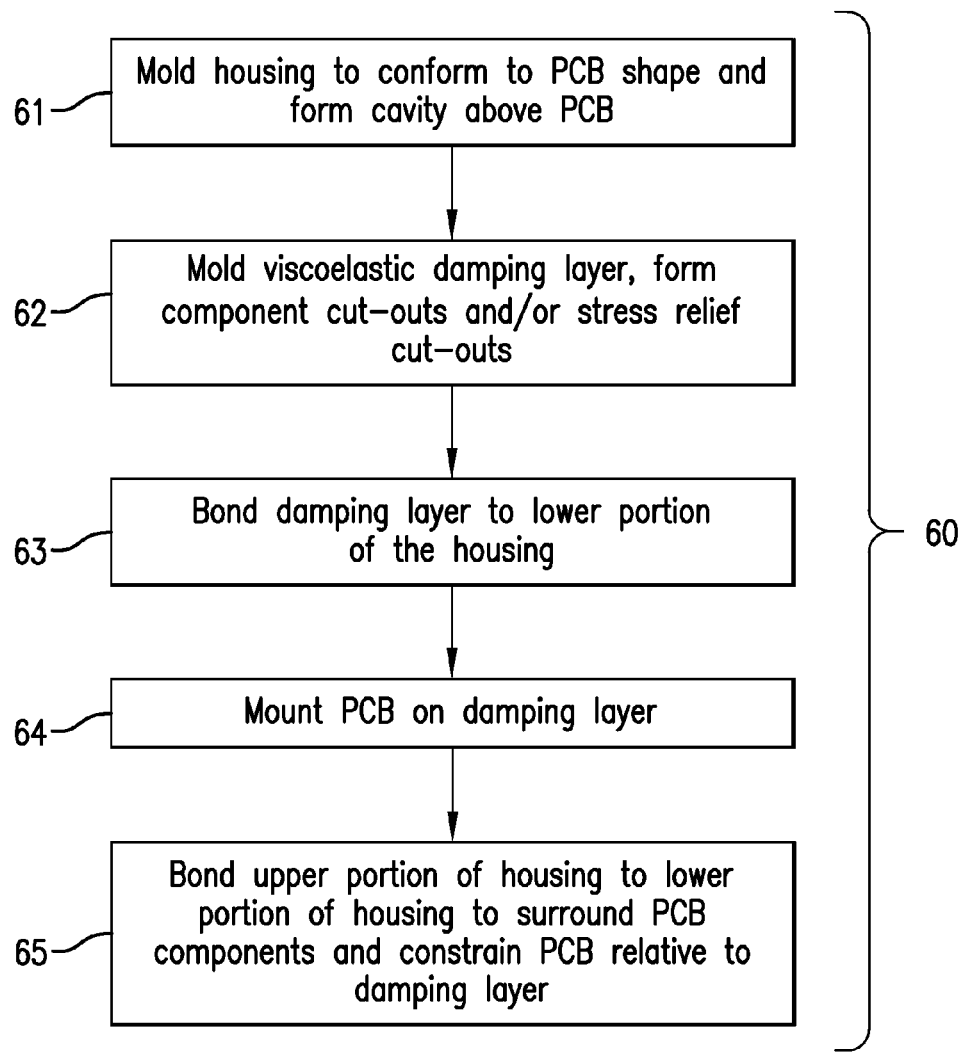
FIG. 7 is a flow chart illustrating an embodiment of a method of manufacturing an electronics packaging assembly.

Referring to FIG. 4, the viscoelastic pad or layer 32 is configured to maximize damping of vibration through localization of strain energy. The damping layer 32 has a selected thickness that is dependent upon the dimensions of a planar surface of the layer 32, the stiffness of the material comprising layer 32, the effective bending stiffness of the PCB 28, and the total mass of the PCB 28.

In one embodiment, the damping layer 32 includes one or more holes or cut-outs 50, 52 through the thickness of the layer 32. For example, a hole or cut-out 50 surrounds each portion of a component 40 that extends beyond the lower surface of the PCB 28. The cut-outs 50 may generally conform to the planar shape of the extending portion of the electronic component, and have a size sufficient to provide a clearance (e.g., 1 mm) around the extending portion to allow for thermal expansion and prevent development of stresses that can be associated with a (thermoelastically) constrained volume in the layer 32.

In one embodiment, the damping layer 32 includes one or more thermoelastic stress-relief holes or cut-outs 52 configured to allow for thermal expansion without creation of hydrostatic or volumetrically constrained stresses of the damping layer 32, and allow the damping layer 32 to remain flush against the PCB 28 and the lower portion 36. As shown in FIG. 4, exemplary thermoelastic stress relief cut-outs include a plurality of circular (or other shaped) cut-outs arrayed along the planar surface of the pad. These stress relief cutouts are configured to prevent the development of hydrostatically 'locked' volumes in the layer 32 under temperature excursions, by limiting a damping layer region length to, e.g., approximately equal to or less than 8 times the damping layer thickness.

One embodiment of a method 60 of manufacturing an electronics packaging assembly is shown in FIG. 4. The method 60 includes one or more stages 61-65. In one embodiment, the method 60 includes the execution of all of stages 61-65 in the order described. However, certain stages may be omitted, stages may be added, or the order of the stages changed.

In the first stage 61, the housing 30 is molded to conform to the shape of the PCB 28 and to form a cavity 38 between the PCB components and an interior surface of the housing 30. For example, the upper portion 34 is molded with cavity features sufficient to allow for large components on the top of the PCB 28 to be housed therein without contacting the top portion interior surface. In addition, the lower portion 36 is molded to constrain the PCB 28 along its edge (in cooperation with a damping layer 32) within the housing 30.

In the second stage 62, a viscoelastic damping layer 32 is molded as a separate part and includes various features, such as holes or cut-outs 50, 52, to accommodate components that may be designed on or extend through the bottom of the PCB 28. The damping layer 32 is molded so that it can be disposed in the lower portion 36 and have maximum contact with both the PCB 28 (e.g., the bottom and sides of the PCB) and the lower portion 36. In addition, the damping layer 32 may be formed to include the cut-outs 50, 52, or the cut-outs 50, 52 may be cut out of the layer 32 after molding.

In the third stage 63, the damping layer 32 is bonded to the lower portion 36 of the housing 30. For example, the lower portion 36 and the damping layer 32 are initially bonded using a high-temperature structural adhesive, then clamped in an assembly mold and oven cured.

In the fourth stage 64, the PCB 28 is mounted on the damping layer 32. For example, a masking screen is used to apply a high-temperature structural adhesive layer to the viscoelastic damping layer 32 at the interface with the PCB 28. The PCB 28 is mounted onto the adhesive layer, then clamped in a mold and oven cured.

In the fifth stage 65, the upper portion 34 is positioned on the lower portion 36 and bonded thereto. For example, a high-temperature structural adhesive is applied to the interface between the upper and lower portions. The upper portion 34 is assembled onto the lower portion 36 and the entire assembly is clamped in a mold and oven cured. In one embodiment, the upper portion 34 at least slightly overlaps the edge of the PCB 28 to promote directed load path behavior.

The packaging devices, systems and methods described herein provide numerous advantages. The embodiments described herein exhibit relative insensitivity in dynamic and thermal response to temperature changes up to, e.g., about 200° C., and also exhibit closely non-resonant dynamic response characteristics over a frequency range that is very broad (e.g., zero to about 2 kHz) relative to expected downhole random vibration environments. Such configurations retain and in certain instances surpass the robustness of prior art solid-molded packaging approaches as well as highly conductive thermal paths intrinsic to grommet-mounted approaches. The configurations described herein also eliminate disadvantages created from potential fatigue concerns within tool pockets due to prior-art use of threaded holes for PCB mounting.

The design approaches described herein also reduce or eliminate thermoelastic stresses in PCB electronics due to thermal expansion mismatches or other changes in housing material volume, while maintaining handling robustness for assembly into a tool, as well as a high thermally conductive path for electronics heat dissipation.

Figure 8:
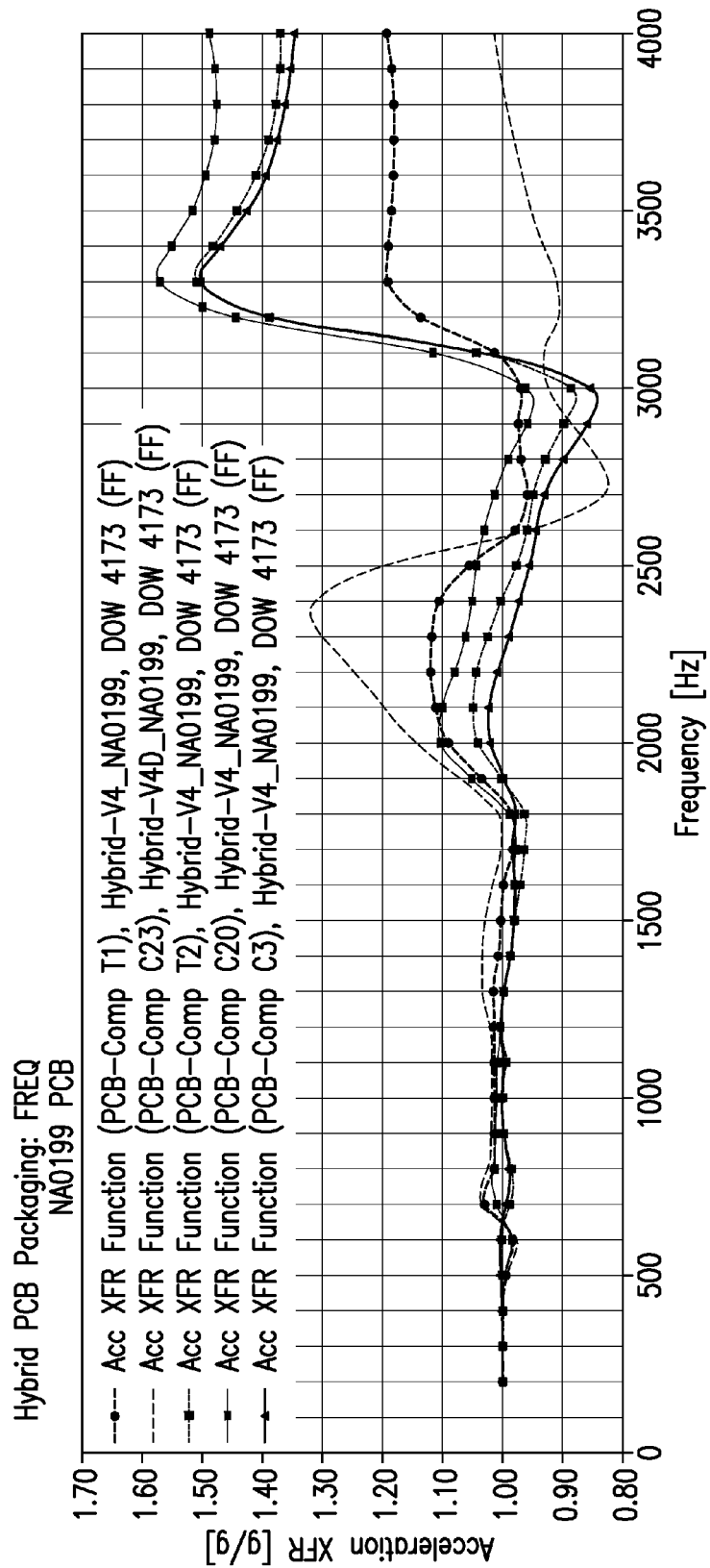
FIG. 8 is a graph illustrating frequency responses of a printed circuit board disposed within an electronics packaging assembly.

FIG. 8 illustrates some advantageous attributes of an exemplary electronic component packaging assembly including a PCB (similar to that shown in FIG. 3) that is attached to a downhole component (in this example, constrained to a drill collar) as described above. This example shows some fundamental parameters affecting the dynamic transmissibility response of the PCB over frequency, which are analyzed via a finite element analysis.

A series of frequency response analyses of the PCB was conducted to determine a set of design details satisfying the primary goals of high resonant frequency (e.g., >1000 Hz), and low transmissibility (e.g., Q<3). Dynamic loading was applied to the packaging assembly along the axis normal to the plane of the PCB.

The analytical results in the plot of FIG. 8 indicate that no significant resonant response is expected below 2 kHz. For example, the dominant acceleration response of a component C20 of the PCB occurs at a very high resonant frequency of about 3300 Hz. The dominant acceleration response below 3 kHz occurs at a component C23 of the PCB at around 2400 Hz, with an amplification Q<1.40.

In support of the teachings herein, various analyses and/or analytical components may be used, including digital and/or analog systems. The system may have components such as a processor, storage media, memory, input, output, communications link (wired, wireless, pulsed mud, optical or other), user interfaces, software programs, signal processors (digital or analog) and other such components (such as resistors, capacitors, inductors and others) to provide for operation and analyses of the apparatus and methods disclosed herein in any of several manners well-appreciated in the art. It is considered that these teachings may be, but need not be, implemented in conjunction with a set of computer executable instructions stored on a computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user or other such personnel, in addition to the functions described in this disclosure.

One skilled in the art will recognize that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood by those skilled in the art that various changes may be made and equivalents may be substituted for elements thereof without departing from the scope of the invention. In addition, many modifications will be appreciated by those skilled in the art to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An electronic component package for installation on a tool, the package comprising:

a solid molded housing configured to hold an electronic component support structure and surround electronic components disposed on the support structure;

the housing including a first portion configured to hold the support structure, and a second portion forming a cavity around the electronic components disposed on the support structure and isolating the electronic components from contact with the housing; and a viscoelastic damping layer disposed within the first portion, the viscoelastic damping layer configured to damp vibrations and strain transmitted from the tool, the viscoelastic damping layer forming a constrained layer between the support structure and the first portion and configured to isolate the support structure from the housing, the first portion of the housing including a recess configured to constrain the viscoelastic damping layer.

2. The package of claim 1, wherein the tool includes a receiving cavity, and the bottom portion is configured to contact an interior surface of the receiving cavity and constrain the damping layer between the tool and the support structure.

3. The package of claim 1, wherein the damping layer includes a bottom layer conforming to an area of the support structure and sidewalls configured to contact at least two sides of the support structure, and the first portion of the housing includes a recess configured to constrain the bottom layer and the sidewalls.

4. An electronic component package for installation on a tool, the package comprising:

a solid molded housing configured to hold an electronic component support structure and surround electronic components disposed on the support structure;

the housing including a first portion configured to hold the support structure, and a second portion forming a cavity around the electronic components disposed on the support structure and isolating the electronic components from contact with the housing, the second portion including one or more protrusions configured to contact the tool and transmit vibrational energy through the housing to the damping layer; and a viscoelastic damping layer disposed within the first portion, the viscoelastic damping layer configured to damp vibrations and strain transmitted from the tool, the viscoelastic damping layer forming a constrained layer between the support structure and the first portion and configured to isolate the support structure from the housing.

5. The package of claim 1, wherein the support structure is a printed circuit board.

6. The package of claim 1, wherein the damping layer includes a plurality of holes extending therethrough and configured to allow for relief of hydrostatically thermal expansion stresses of the constrained damping layer.

7. The package of claim 3, wherein the bottom portion of the damping layer includes a plurality of holes extending therethrough and configured to allow for relief of hydrostatically thermal expansion stresses of the constrained damping layer.

8. The package of claim 7, wherein the support structure includes at least one electronic component extending from the support structure toward the bottom layer, and the plurality of holes includes at least one hole conforming to a planar shape of the at least one electronic component.

9. The package of claim 8, wherein the at least one hole has a shape providing a clearance around the at least one electronic component to allow for relief of hydrostatically thermal expansion stresses of the damping layer.

10. The package of claim 7, wherein the plurality of holes includes an array of separate cut-outs distributed on the bottom layer of the damping layer.

11. The package of claim 3, wherein the tool includes a receiving cavity having a flat surface, and a bottom surface of the first portion is configured to be disposed flush to a receiving cavity surface for diffusion of thermal energy from the support structure to the tool.

12. The package of claim 1, wherein the first portion and the second portion are separate portions configured to be bonded together to hold the support structure in a constrained position relative to the housing.

13. An electronic component package for installation on a tool, the package comprising:
a solid molded housing configured to hold an electronic component support structure and surround electronic components disposed on the support structure; and
a viscoelastic damping layer disposed within the housing, the viscoelastic damping layer configured to contact the support structure and damp vibrations through directed strain energy transmitted from the tool, the damping layer including a plurality of holes extending therethrough and configured to relieve stresses created by thermal expansion of the damping layer.

14. The package of claim 13, wherein the viscoelastic damping layer forms a constrained layer between the support structure and the housing and is configured to isolate the support structure from the housing.

15. The package of claim 14, wherein the tool includes a receiving cavity, and the housing is configured to contact an interior surface of the receiving cavity and constrain the damping layer between the tool and the support structure.

16. The package of claim 14, wherein the support structure includes at least one electronic component extending from the support structure toward the damping layer, and the plurality of holes includes at least one hole conforming to a shape of the at least one electronic component.

17. The package of claim 16, wherein the at least one hole has a shape providing a clearance around the at least one electronic component to allow for relief of hydrostatically thermal expansion stresses in the damping layer.

18. The package of claim 14, wherein the plurality of holes includes an array of separate cut-outs distributed on the damping layer.

19. The package of claim 13, wherein the tool includes a receiving cavity having a flat surface, and the damping layer is configured to be constrained between the support structure and the flat surface and disposed flush to the flat surface for diffusion of thermal energy from the support structure to the tool.

20. The package of claim 13, wherein the support structure is a printed circuit board.

* * * * *